(12) United States Patent
Kawakami et al.

(10) Patent No.: US 7,724,793 B2
(45) Date of Patent: May 25, 2010

(54) NITRIDE SEMICONDUCTOR LASER ELEMENT AND FABRICATION METHOD THEREOF

(75) Inventors: Toshiyuki Kawakami, Mihara (JP); Yukio Yamasaki, Daito (JP); Shuichiro Yamamoto, Mihara (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 11/605,305

(22) Filed: Nov. 29, 2006

(65) Prior Publication Data

US 2007/0121692 A1 May 31, 2007

(30) Foreign Application Priority Data

Nov. 30, 2005 (JP) .............................. 2005-345746
Nov. 27, 2006 (JP) .............................. 2006-318141

(51) Int. Cl.
*H01S 5/00* (2006.01)
*H01S 5/02* (2006.01)
*H01S 5/323* (2006.01)

(52) U.S. Cl. .................................................. 372/43.01

(58) Field of Classification Search ............... 372/43.01
See application file for complete search history.

(56) References Cited

U.S. PATENT DOCUMENTS

| 5,780,876 A | * | 7/1998 | Hata ........................... 257/103 |
| 7,083,994 B2 | * | 8/2006 | O'Gorman .................... 438/29 |
| 2003/0030053 A1 | * | 2/2003 | Kawakami et al. ............ 257/72 |
| 2005/0025204 A1 | * | 2/2005 | Kamikawa et al. ........... 372/43 |
| 2007/0051961 A1 | | 3/2007 | Kamikawa et al. |

FOREIGN PATENT DOCUMENTS

| JP | 2000058965 | * | 2/2000 |
| JP | 2004-111997 | | 4/2004 |
| JP | 2005-311308 | | 11/2005 |
| WO | WO 2004/086579 | * | 10/2004 |

* cited by examiner

*Primary Examiner*—Minsun Harvey
*Assistant Examiner*—Michael Carter
(74) *Attorney, Agent, or Firm*—Morrison & Foerster LLP

(57) ABSTRACT

At each side of a ridge stripe 110, a trench is formed as a region carved relative to a wafer surface so that, at the time of cleaving, a surface irregularity that develops at a mirror facet near an active layer is prevented from reaching the ridge stripe 110.

26 Claims, 13 Drawing Sheets

NITRIDE SEMICONDUCTOR LASER ELEMENT AND FABRICATION METHOD THEREOF

This nonprovisional application claims priority under 35 U.S.C. §119(a) on Patent Applications Nos. 2005-345746 and 2006-318141 filed in Japan on Nov. 30, 2005 and Nov. 27, 2006 respectively, the entire contents of which are hereby incorporated by reference.

BACKGROUND OF THE INVENTION

1. Field of the Invention

The present invention relates to a nitride semiconductor laser element and to a fabrication method thereof. More particularly, the present invention relates to a nitride semiconductor laser element having a nitride semiconductor laid on a substrate, like a nitride semiconductor substrate, that has a defect-concentrated region, and to a fabrication method of such a nitride semiconductor laser element.

2. Description of Related Art

Nitride semiconductors are compounds of a group III element—such as Al, Ga, or In—and N, which is a group V element. For their band structure and chemical stability, nitride semiconductors have been arousing expectations as materials for light-emitting elements and power devices, and have been tried in various applications. Particularly many attempts have been made to fabricate, as light sources for optical information recording apparatuses, nitride semiconductor laser elements that emit blue light.

In such a nitride semiconductor laser element, using a nitride semiconductor substrate that has the same cleavage direction as the nitride semiconductor layer laid on the surface thereof helps improve the lattice matching between the substrate and the nitride semiconductor layer laid thereon, and also helps eliminate a difference in thermal expansion coefficient. In that way, it is possible to reduce the strains, defects, and the like that develop in the nitride semiconductor laser element, and thereby to extend its lifetime. Inconveniently, however, a nitride semiconductor substrate contains defects (such as voids, interstitial atoms, and dislocations, which disturb the regularity of the crystal), and the density of such defects strongly affects the lifetime of the nitride semiconductor laser element.

Thus, in nitride semiconductor substrates, reduced defect densities are sought. One publicly reported method for fabricating a GaN substrate with a low defect density is as follows (see Applied Physics Letter. Vol. 73 No. 6 (1998) pp. 832-834). By an MOCVD (metal organic chemical vapor deposition) process, on a sapphire substrate, a 2.0 μm thick GaN layer is grown and then, further thereon, a 0.1 μm thick $SiO_2$ mask pattern having periodic stripe-shaped openings (with a period of 11 μm) is formed; then, again by an MOCVD process, a 20 μm thick GaN is formed. In this way, a wafer is produced.

This is a technology called an ELOG (epitaxial lateral overgrowth) process, which exploits lateral growth to reduce defects. Subsequently, by an HVPE (hydride vapor phase epitaxy) process, a 200 μm thick GaN layer is formed, and then the sapphire substrate that forms the base layer is removed. In this way, a 150 μm thick GaN substrate is produced, and its surface is then polished flat. It is known that the GaN substrate thus produced has a dislocation density as low as $10^6$ $cm^{-2}$ or less.

Inconveniently, however, even when a nitride semiconductor laser element is fabricated by laying a nitride semiconductor layer on such a low-defect nitride semiconductor substrate, since the nitride semiconductor layer itself is composed of different kinds of film such as GaN, AlGaN, and InGaN, the differences in lattice constant among the individual films forming the nitride semiconductor layer produce lattice mismatch. As a result, the nitride semiconductor layer develops strains and cracks, which greatly influence the deterioration and hence the yield of the nitride semiconductor laser element.

Under this background, there has been developed the following method. A nitride semiconductor substrate is used that has, formed on the surface thereof, a groove, i.e., a lower-leveled portion, and a ridge, i.e., a higher-leveled portion. On this nitride semiconductor substrate, a nitride semiconductor layer is grown. This releases the strains in the nitride semiconductor layer, and thus helps reduce cracks. With this method, it is possible to reduce the cracks and strains attributable to the substrate and also the cracks and strains attributable to the lattice mismatch among the individual films forming the nitride semiconductor layer formed on the substrate. In this way, it is possible to alleviate the deterioration of and hence improve the yield of the nitride semiconductor laser element (see JP-A-2004-356454 and JP-A-2005-064469).

FIG. 11 is a cross-sectional view of the conventional nitride semiconductor laser element just described. This nitride semiconductor laser element 50 has an n-type GaN substrate 501 as a nitride semiconductor substrate. The n-type GaN substrate 501 has, in a part thereof, a defect-concentrated region 518, and has, elsewhere than in the defect-concentrated region 518, a low-defect region. On the n-type GaN substrate 501, a nitride semiconductor layer is grown epitaxially. Thus, this nitride semiconductor layer also has, in a part thereof, a defect-concentrated region 518a grown from the defect-concentrated region 518 of the n-type GaN substrate 501, and have, elsewhere than in the defect-concentrated region 518a, a low-defect region. Moreover, the n-type GaN substrate 501 is etched in a part thereof where it has the defect-concentrated region 518 to form a stripe-shaped groove, so that, in a part where the defect-concentrated regions 518 and 518a of the n-type GaN substrate 501 and the nitride semiconductor layer are located, a groove 500 is formed that appears etched relative to the low-defect region.

More specifically, in the n-type GaN substrate 501, above the defect-concentrated region 518, a 6 μm deep groove 500a is formed. Then, on this n-type GaN substrate 501, a nitride semiconductor layer is laid through semiconductor growth using an MOCVD (metal organic chemical vapor deposition) method. The nitride semiconductor layer thus formed on the n-type GaN substrate 501 is composed of, from the bottom up: a lower contact layer 502 formed of n-type GaN; lower three-layer clad layers 503 formed of n-type AlGaN of different compositions; a lower guide layer 504 formed of n-type GaN; an active layer 505 composed of a multiple quantum well structure formed of InGaN; an evaporation prevention layer 506 formed of p-type AlGaN; an upper guide layer 507 formed of p-type GaN; an upper clad layer 508 formed of p-type GaN; and an upper contact layer 509 formed of p-type GaN.

Furthermore, the nitride semiconductor laser element 50 has a ridge stripe 510 formed on the low-defect region of the nitride semiconductor layer. Moreover, over both side walls of the ridge stripe 510 and over the etched floor surface that appears when the ridge stripe 510 is formed, a burying layer 511, which is a dielectric layer formed of $SiO_2$, is laid to produce a stepwise refractive index distribution parallel to the active layer 505 and thereby to achieve confinement in a horizontal lateral mode. The burying layer 511 also serves as a current constricting layer, and thereby permits electric power to be supplied only via the summit of the ridge stripe 510. To enable the nitride semiconductor laser element 50 to receive electric power from outside, a p-type electrode 512 is deposited over the summit of the ridge stripe 510 and over the burying layer 511, and an n-type electrode 513 is deposited over the entire bottom surface of the nitride semiconductor laser element 50.

The nitride semiconductor laser element 50 structured as described above achieves confinement of light with the stepwise refractive index distribution in the ridge stripe 510, and thereby achieves stable lasing in a horizontal lateral mode. When actually fabricated samples of this nitride semiconductor laser element are operated at 60° C., at a low output of 30 mW, a proportion as large as 80% of them have lifetimes of 3 000 hours or more. Thus, by forming in the wafer a groove that produces a carved region 500 as described above, it is possible to achieve extremely high yields.

Inconveniently, however, when conventional nitride semiconductor laser elements 50 fabricated by common processes such as photolithography, vacuum evaporation, polishing, cleaving, and coating are operated in CW (continuous wave) lasing up to an output as high as 100 mW or more, a certain proportion of them end up in element breakdown without reaching a sufficient optical output to achieve the desired reliability. Among these conventional nitride semiconductor laser elements, the proportion of those that end up in element breakdown increases as the duration they are operated increases. Thus, depending on the operating conditions, it may occur that most of the fabricated nitride semiconductor laser elements 50 do not offer the desired reliability. As a result, when conventional nitride semiconductor laser elements are fabricated as elements to be operated at an output as high as 100 mW or more, not only are their yields extremely low, but also, when actually operated for long durations, they are liable to suffer sudden breakdown.

Investigating the Cause of Failure of Nitride Semiconductor Laser Elements

To investigate the cause of the breakdown that a conventional nitride semiconductor laser element 50 structured as shown in FIG. 11 suffers before reaching a sufficient optical output, we, the applicant of the present application, conducted an examination of the nitride semiconductor laser element 50. Specifically, to investigate the cause of the breakdown of the nitride semiconductor laser element 50, with samples thereof that suffered breakdown, we removed the coating laid on a mirror facet thereof, and examined a ridge stripe 510 portion of the mirror facet under an electronic microscope.

Through the examination of the ridge stripe 510 portion of the mirror facet under an electronic microscope, we confirmed that, as shown in FIG. 12, which is an enlarged schematic view of the ridge stripe 510 portion, a surface irregularity 517 had developed on the mirror facet of the nitride semiconductor layer, the surface irregularity 517 extending parallel to the nitride semiconductor layer. This surface irregularity 517 that developed on the mirror facet had a shape as shown in FIG. 13A or 13B, either of which is an enlarged schematic cross-sectional view taken along line A-A shown in FIG. 12.

Here, the side where the p-type electrode 512 was located was the top side, and, whereas the cleavage facet 520 of the part of the nitride semiconductor layer located above the surface irregularity 517 and the cleavage facet 521 of the part of the nitride semiconductor layer located below the surface irregularity 517 were both flat, with a surface roughness of about 3 Å in RMS value, the surface irregularity 517 was as large as several tens of nanometers. That is, either, as shown in FIG. 13A, the cleavage facet 521 below the surface irregularity 517 projected relative to the cleavage facet 520 above the surface irregularity 517 or, as shown in FIG. 13B, the cleavage facet 520 above the surface irregularity 517 projected relative to the cleavage surface 521 below the surface irregularity 517. Moreover, as shown in FIG. 14, which is a schematic view of the entire cleavage facet, the surface irregularity 517 extended parallel to the nitride semiconductor layer over a length of several tens of micrometers to several hundred micrometers.

We then examined particularly closely, of the above surface irregularity 517 that developed on the mirror facet of the nitride semiconductor laser element 50, the portion where the ridge stripe 510 confined light. We thereby found that the surface irregularity 517 concentrated at the interfaces between the individual layers, such as the active layer 505 and the evaporation prevention layer 506, located between the lower guide layer 504 and the upper guide layer 507. On the other hand, we also confirmed that, without such a surface irregularity 517, the nitride semiconductor laser element 50 offered sufficient reliability when operated at an output as high as 100 mW or more.

As described above, conventional nitride semiconductor laser elements are prone to develop a surface irregularity on the mirror facet, the surface irregularity extending parallel to the nitride semiconductor layer. As a result, when operated in CW lasing up to a high output, they may suffer element breakdown without reaching a sufficient optical output. Thus, when they are fabricated as elements to be operated at an output as high as 100 mW or more, not only are the yields of properly functioning elements extremely low, but also, when actually operated for long durations, they may suffer sudden breakdown.

SUMMARY OF THE INVENTION

In view of the conventionally experienced inconveniences discussed above, it is an object of the present invention to provide a nitride semiconductor laser element that is so structured as to alleviate the development of a surface irregularity in a nitride semiconductor layer. It is another object of the present invention to provide a method for fabricating a nitride semiconductor laser element that boasts of alleviated development of a surface irregularity in a nitride semiconductor layer, and thereby to improve the yields and reliability of the nitride semiconductor laser element.

To achieve the above objects, according to one aspect of the present invention, a nitride semiconductor laser element is provided with: a substrate; a nitride semiconductor layer grown on the surface of the substrate, the nitride semiconductor layer including an active layer generating laser light and an evaporation prevention layer preventing deterioration of the active layer; a stripe-shaped waveguide formed in the nitride semiconductor layer to serve as a light confinement region; a mirror facet formed as a result of the nitride semiconductor layer being cleaved; and a trench formed at the mirror facet, at least at one side of the stripe-shaped waveguide, the trench being formed as a carved region having an opening at the surface of the nitride semiconductor layer, the trench having the floor surface thereof located in the vicinity of the evaporation prevention layer.

According to another aspect of the present invention, a method for fabricating a nitride semiconductor laser element involves: a first step of epitaxially growing, on a substrate, a nitride semiconductor layer including an active layer generating laser light and an evaporation prevention layer preventing deterioration of the active layer; a second step of forming, in the nitride semiconductor layer formed in the first step, a stripe-shaped waveguide serving as a light confinement region; a third step of cleaving, along with the substrate, the nitride semiconductor layer having the stripe-shaped waveguide formed therein; and a fourth step of carving the nitride semiconductor layer from the surface thereof down to the vicinity of the evaporation prevention layer so as to form, at a mirror facet formed as a result of cleaving performed in the third step, at least at one side of the stripe-shaped waveguide, a trench as a carved region having an opening at the surface of the nitride semiconductor layer.

Thus, according to the present invention, owing to the trench being formed, a surface irregularity that develops on a mirror facet at the time of cleaving can be reset by the trench. Thus, the surface irregularity that develops on the mirror facet is reset by the trench located near the location from which the surface irregularity originates, and this prevents a surface irregularity to develop in the stripe-shaped waveguide that emits laser light. This makes it possible to fabricate, at high yields, nitride semiconductor laser elements that, even when operated for long durations, can emit laser light reliably enough at outputs over 100 mW.

DETAILED DESCRIPTION OF PREFERRED EMBODIMENTS

Hereinafter, embodiments of the present invention will be described with reference to the accompanying drawings.

Investigating Surface Irregularities On a Cleavage Surface

As mentioned previously in the section headed "Description of Related Art", we investigated the failure of conventional nitride semiconductor laser elements, and confirmed that a surface irregularity 517 that developed on a mirror facet as shown in FIGS. 12, 13A, 13B, and 14 caused element breakdown when the nitride semiconductor laser elements were operated at an output as high as 100 mW or more. Accordingly, we then investigated the condition of the nitride semiconductor laser elements in which a surface irregularity 517 was liable to develop on a mirror facet. In the various experiments and inspections that are going to be presented below, we used the same nitride semiconductor laser element 50 structured as shown in FIG. 11 as in the previously mentioned examination thereof we conducted to investigate its failure.

Figure 11:
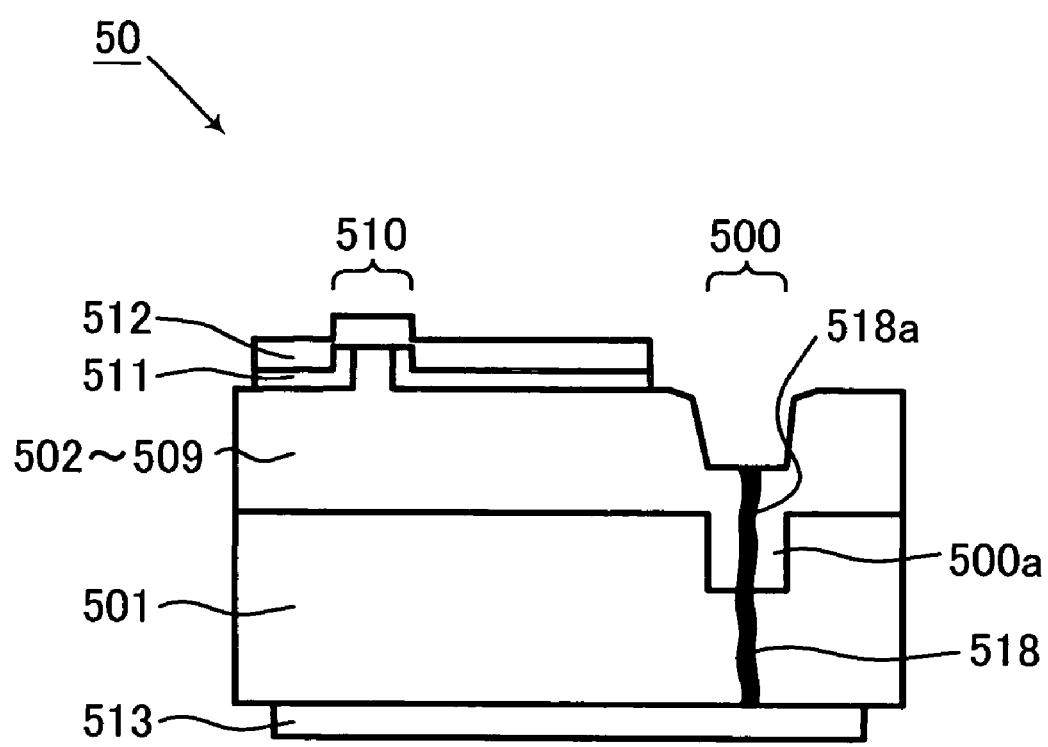
FIG. 11 is a schematic cross-sectional view of a conventional nitride semiconductor laser element.
Figure 12:
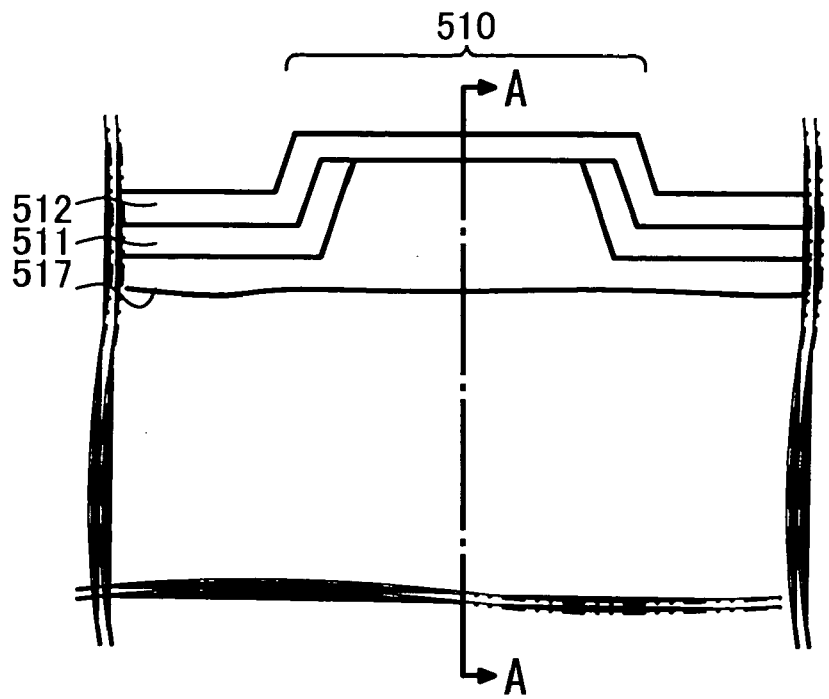
FIG. 12 is an enlarged schematic view of the ridge stripe portion of the nitride semiconductor laser element shown in FIG. 11.
Figure 13A:
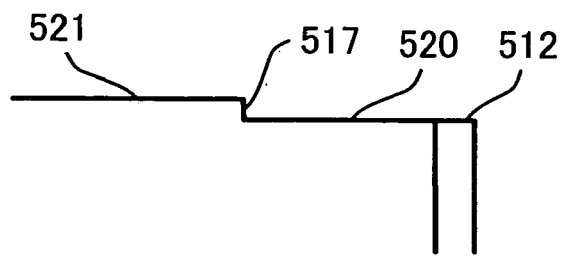
FIGS. 13A and 13B are cross-sectional views of the ridge stripe portion shown in FIG. 12, taken along line A-A.
Figure 13B:
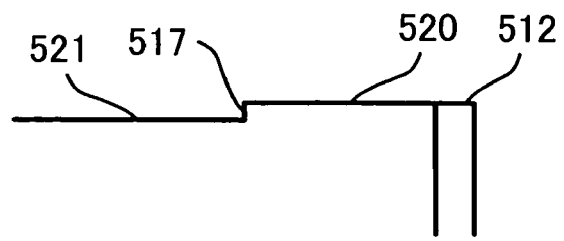

First, we fabricated samples of the nitride semiconductor laser element 50 structured as shown in FIG. 11 while varying the level of the etched floor surface that appeared when the ridge stripe 510 was formed, in order to determine, for each of the different etched floor surfaces levels, the incidence of a surface irregularity 517. Through this experiment, we found that, when the thickness of the film left between the etched floor surface that appeared when the ridge stripe 510 was formed and the top surface of the evaporation prevention layer 506 (which thickness is called the unetched thickness) was more than 0.05 µm, the incidence of a surface irregularity 517 in the nitride semiconductor laser element 50 sharply increased. On the other hand, we also found that no surface irregularity was observed in samples of the nitride semiconductor laser element 50 in which etching was performed down to the evaporation prevention layer 506 when the ridge stripe 510 was formed.

Figure 14:
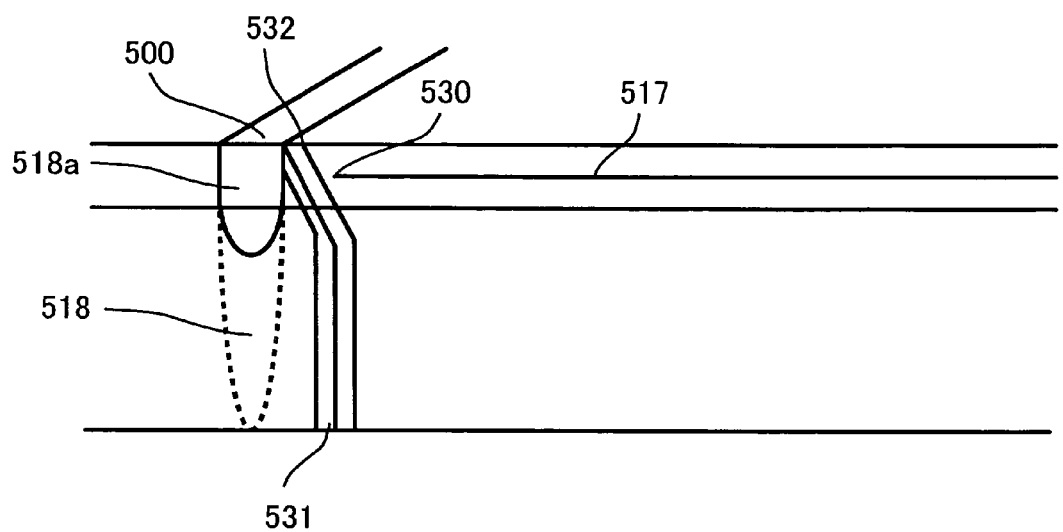
FIG. 14 is a schematic view showing the condition of an entire cleavage surface in the nitride semiconductor laser element shown in FIG. 11.
Figure 15:
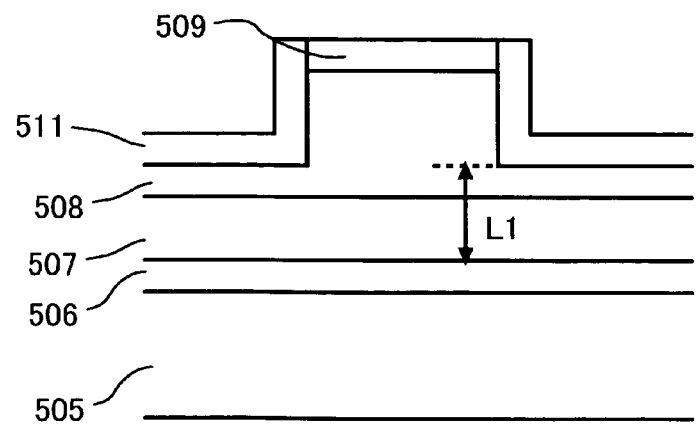
FIG. 15 is a diagram showing the relationship between the etched floor surface that appears when the ridge stripe is formed and the top surface of the evaporation prevention layer in the nitride semiconductor laser element shown in FIG. 11.

Next, we inspected, parallel to the nitride semiconductor layer, the surface irregularity 517 that developed in the nitride semiconductor laser element 50 structured as shown in FIG. 11, in order to investigate the cause of the development of a surface irregularity 517 on a mirror facet. Through this inspection, we found the following. As shown in FIG. 14, in the portion from which the surface irregularity 517 apparently originated, shell-shaped steps (surface irregularities in a plurality of steps) 531, which were considered to be disturbances in the wavefront of a shock wave that appeared on the mirror facet when cleaving was performed to produce it, had developed to cross over the individual layers of the nitride semiconductor layer. That is, a plurality of steps 531 of which each extended across the nitride semiconductor layer were formed side by side parallel to the nitride semiconductor layer.

We further inspected the location from which originated the shell-shaped steps 531 that appeared near the location from which originated the surface irregularity 517, and found the following. At the location from which originated the shell-shaped steps 531, with an incidence of 70% or more, there existed either a groove with a surface irregularity of the order of microns that formed a carved region 500 in the wafer surface where a plurality of individual nitride semiconductor laser elements 50 before being cleaved are continuously formed, or a defect-concentrated region 518 of the n-type GaN substrate 501. In a case where, at the location from which originated the steps 531, there existed neither a groove that formed a carved region 500 nor a defect-concentrated region 518 of the n-type GaN substrate 501, the steps were caused by a deviation of a splitting line (cleaving line) which was assumed to have resulted from a deviation in alignment at the time of cleaving.

From the foregoing, it will be understood that, when cleaving is performed to form a mirror facet of the nitride semiconductor laser element 50, if simply there is a groove with a surface irregularity of the order of microns in the wafer surface, or if simply there is a defect-concentrated region 518 in the n-type GaN substrate 501, or if simply there is a deviation in the alignment of a cleavage line, steps 531 are formed by disturbances that appear in the wavefront of a shock wave resulting from cleaving. In addition to the steps 531 thus being formed, if the unetched thickness L1 left when the ridge stripe 510 is formed fulfills the condition mentioned above, a surface irregularity 517 extending parallel to the nitride semiconductor layer is liable to develop near the active layer 505.

This surface irregularity 517 develops both when the wafer is split with a scribe line formed on the top face of the wafer (on the p-type electrode 512 side face thereof, i.e., the face on the side opposite from the n-type GaN substrate 501) and when the wafer is split with a scribe line formed on the bottom face of the wafer (on the n-type electrode 513 side face thereof, i.e., the face on the same side as the n-type GaN substrate 501). The development of the surface irregularity 517 is, however, more notable when the wafer is split when a scribe line formed on the top face thereof.

Figure 1A:
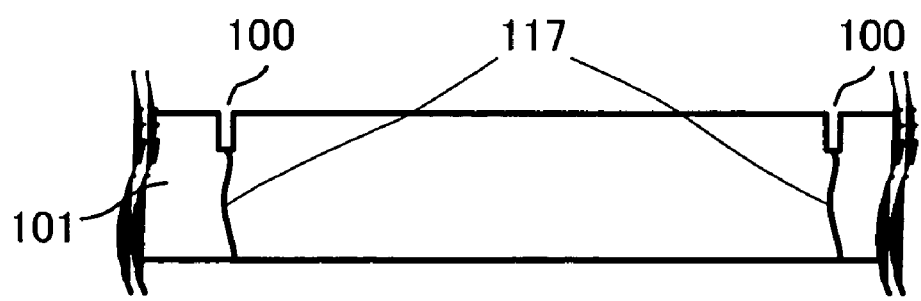
FIGS. 1A and 1B are cross-sectional views of a wafer, illustrating the fabrication procedure of a nitride semiconductor laser element according to the present invention.
Figure 2A:
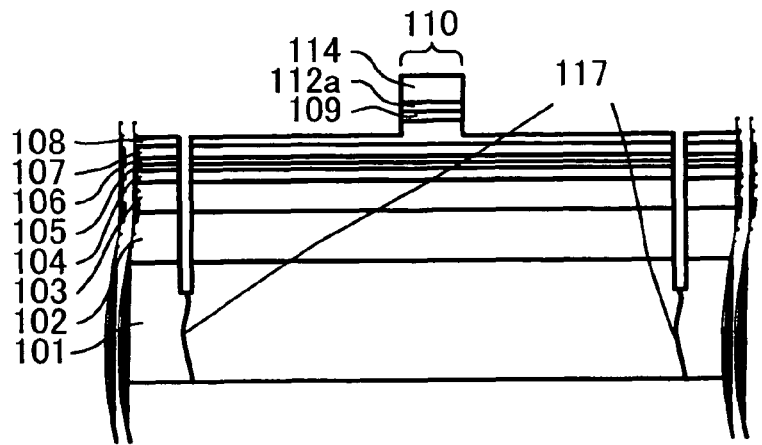
FIGS. 2A to 2C are cross-sectional views of a wafer, illustrating the fabrication procedure of a nitride semiconductor laser element according to the present invention.
Figure 2B:
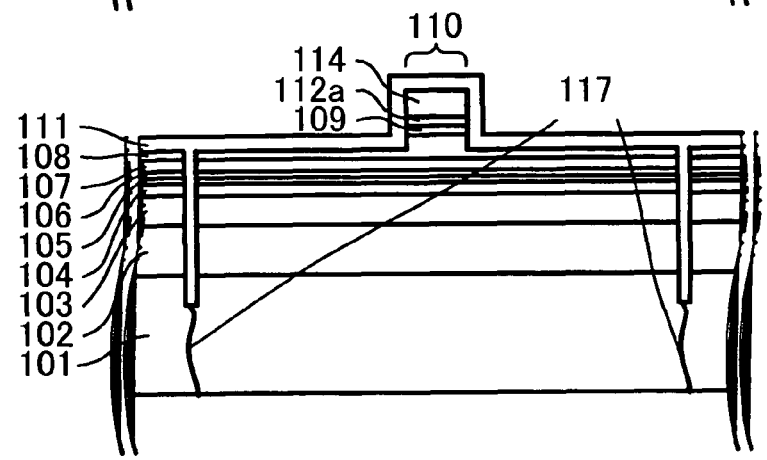
Figure 2C:
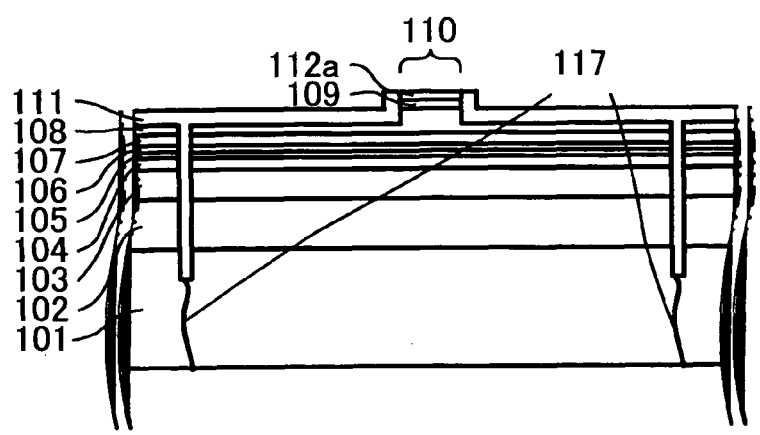
Figure 3A:
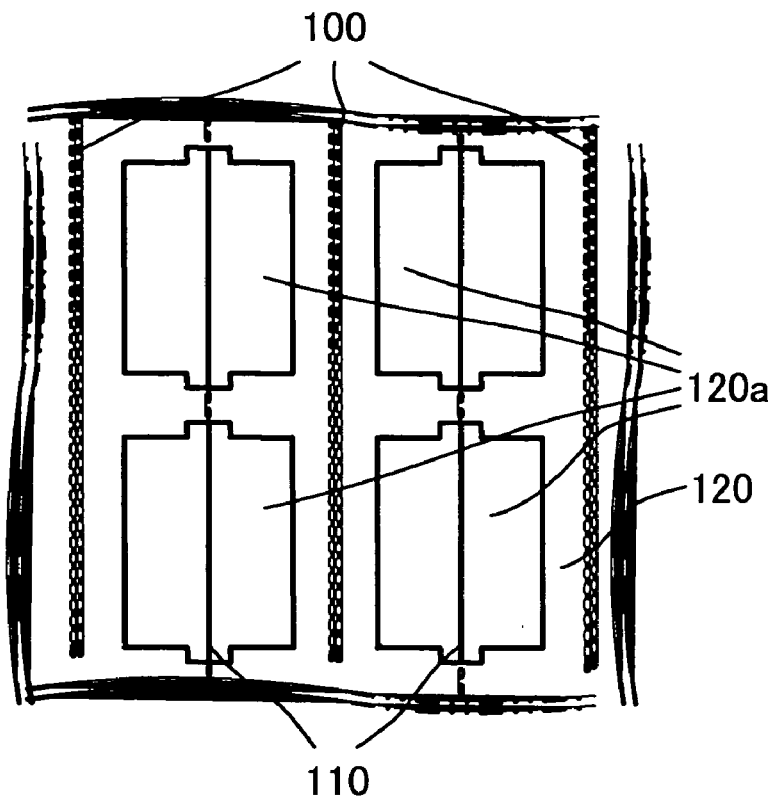
FIGS. 3A and 3B are top views of a wafer, illustrating the fabrication procedure of a nitride semiconductor laser element according to the present invention.
Figure 3B:
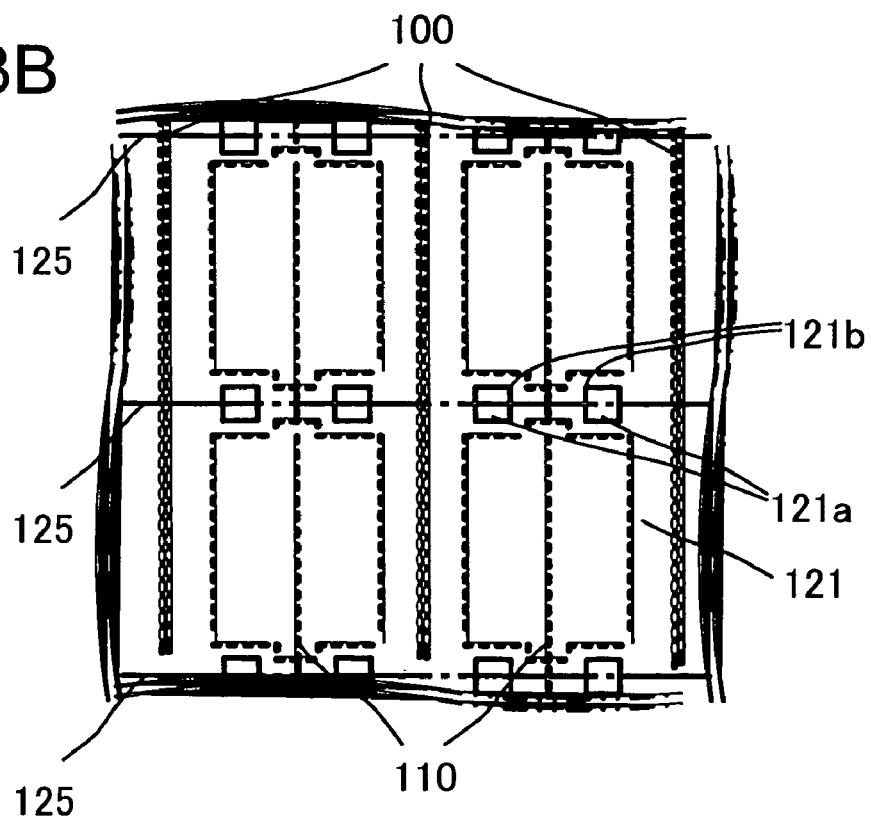

Based on the investigations described above, the inconveniences with the conventional nitride semiconductor laser element 50 described above (see FIG. 11) have been overcome in a nitride semiconductor laser element according to the present invention, which will be described below. Like the conventional nitride semiconductor laser element 50, the nitride semiconductor laser element has a plurality of nitride semiconductor layers laid on a nitride semiconductor substrate by MOCVD under ordinary conditions. FIGS. 1A, 1B, 2A to 2C, and 4 are cross-sectional views of the wafer in different steps during the fabrication of the nitride semiconductor laser element; FIGS. 3A and 3B are top views of the wafer in different steps during the fabrication of the nitride semiconductor laser element; and FIG. 5 is an exterior perspective view showing an outline of the structure of the nitride semiconductor laser element fabricated.

Preparing the substrate

First, the nitride semiconductor substrate will be described with reference to FIG. 1, which is a schematic cross-sectional view of the wafer. The following description assumes that, in this embodiment, an n-type GaN substrate is used as the nitride semiconductor substrate.

First, over the entire surface of an n-type GaN substrate 101 having defect-concentrated regions 117, SiO$_2$ or the like is vapor-deposited with a film thickness of 1 μms, and subsequently, by a common lithography process, a stripe-shaped photoresist pattern having openings above the defect-concentrated regions 117 and the vicinities thereof is formed. Next, by a dry etching technique such as RIE (reactive ion etching), the photoresist pattern and the surface of the n-type GaN substrate 101 in the openings of the photoresist pattern are etched so that, in the openings of the photoresist pattern, grooves are formed in the surface of the n-type GaN substrate 101.

Thereafter, by use of HF (hydrofluoric acid) or the like as an etchant, the photoresist pattern is removed. Now, the n-type GaN substrate 101 is complete with stripe-shaped grooves 100 periodically formed in the surface thereof as shown in FIG. 1A. That is, as a result of the n-type GaN substrate 101 being processed by a combination of photolithography and dry etching, in the surface of the n-type GaN substrate 101, stripe-shaped grooves 100 are formed with a width of 2 μm to 100 μm perpendicularly to the cleavage direction and with a depth of 1 μm to 10 μm. The SiO$_2$ or the like mentioned above may be vapor-deposited by any process other than sputtering; for example, it may be vapor-deposited by an electron beam deposition process or a plasma CVD process.

By forming the grooves 100 in the surface in this way, it is possible to reduce the variation of the thicknesses of the individual nitride semiconductor layers attributable to the defect-concentrated regions 117 in the n-type GaN substrate 101. Even in a case where a nitride semiconductor substrate with no defect-concentrated region 117 is used, by forming stripe-shaped grooves 100 as described above, it is possible to prevent cracks from developing in the nitride semiconductor layers grown on the surface of the nitride semiconductor substrate. When a nitride semiconductor substrate with no defect-concentrated region 117 is used, the grooves 100 may be formed to suite the desired chip size. With either type of nitride semiconductor substrate, it is advisable that the grooves 100 be formed continuously as long as possible.

The grooves 100 in the n-type GaN substrate 101 may be formed by a dry etching technique as described above, or by a wet etching technique.

Forming the Individual Layers by Epitaxial Growth

On the surface of the n-type GaN substrate 101 thus having the grooves 100 formed therein, then, by use of an appropriate conventionally known technique, such as by an MOCVD process, a nitride semiconductor is grown epitaxially to form the individual nitride semiconductor layers. Here, these nitride semiconductor layers are not formed above the grooves 100 in the n-type GaN substrate 101, but are formed, one after another, on the first principal plane, in which the grooves 100 in the n-type GaN substrate 101 are formed.

Figure 1B:
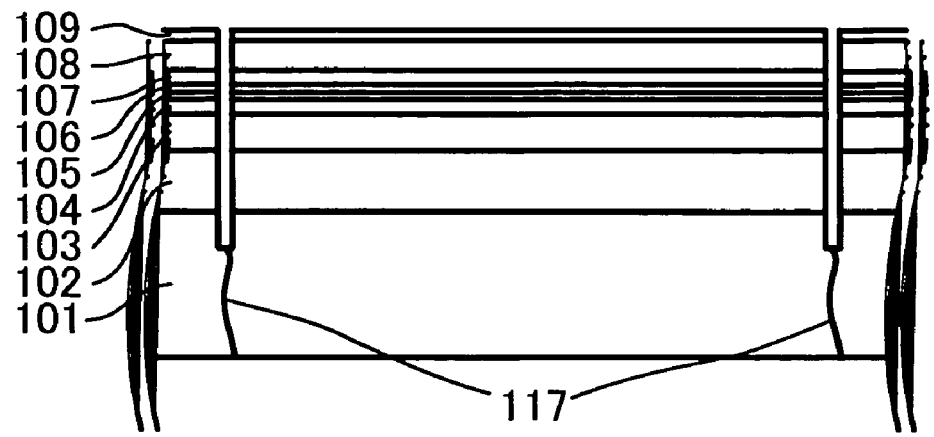

Specifically, as shown in FIG. 1B, on the first principal plane of the n-type GaN substrate 101, the following layers are laid one after another in the order named: an n-type GaN lower contact layer 102 with a thickness of 0.1 μm to 10 μm (for example, 4 μm); an n-type Al$_{0.1}$Ga$_{0.9}$N lower clad layer 103 with a thickness of 0.5 μm to 3.0 μm (for example, 1.0 μm); an n-type GaN lower guide layer 104 with a thickness of 0 μm to 0.2 μm (for example, 0.1 μm); an active layer 105 composed of alternately laid quantum well layers of In$_{x1}$Ga$_{1-x1}$N and barrier layer of Ga$_{1-x2}$N (where x1>x2); a p-type Al$_{0.3}$Ga$_{0.7}$N evaporation prevention layer 106; a p-type GaN upper guide layer 107 with a thickness of 0 μm to 0.2 μm (for example, 0.01 μm); a p-type Al$_{0.1}$Ga$_{0.9}$N upper clad layer 108; and a p-type GaN upper contact layer 109.

The lower clad layer 103 may be formed of any material other than n-type Al$_{0.1}$Ga$_{0.9}$N; it may be formed of any material that offers the desired optical characteristics, for example, a superlattice structure of n-type GaN and n-type AlGaN, or a combination of a plurality of AlGaN layers having different compositions. The lower guide layer 104 and the upper guide layer 107 may respectively be formed of any materials other than n-type and p-type GaN as described above; they may respectively be formed of n-type and p-type InGaN or AlGaN; they may even be omitted if the design does not require them. In the active layer 105, the compositions of its quantum well layers and barrier layers and how they are laid alternately are so designed as to emit light at a wavelength of about 405 nm.

The evaporation prevention layer 106 may be formed of any composition other than $Al_{0.3}Ga_{0.7}N$, or may be doped with an impurity such as As or P, so long as it serves to prevent deterioration of the active layer 105 after the growth of the active layer 105 until the growth of the upper guide layer 107. Like the lower clad layer 103, the upper clad layer 108 may be formed of any material other than p-type $Al_{0.1}Ga_{0.9}N$; it may be formed of any material that offers the desired optical characteristics, for example, a super lattice structure of p-type GaN and p-type AlGaN, or a combination of a plurality of AlGaN layers having different compositions. The upper contact layer 109 may be formed of any material other than p-type GaN; it may be formed of, for example, p-type InGaN, GaInNAs, or GaInNP.

Forming a Ridge Stripe

When the individual nitride semiconductor layers have been grown on the surface of the n-type GaN substrate 101 as described above, the wafer is now complete with a layered nitride semiconductor layer as shown in FIG. 1B. Then, over the entire surface of this wafer, a first p-type electrode 112a, formed mainly of Pd, Ni, or the like, is formed by vapor deposition or the like. Specifically, over the entire surface of the upper contact layer 109, which is the topmost layer in FIG. 1B, the p-type electrode 112a is formed.

Then, by a photolithography process, on the surface of the p-type electrode 112a, which is located on the first principal plane between adjacent grooves 100 in the n-type GaN substrate 101, a stripe-shaped resist pattern 114 is formed with a width of 1 μm to 3 μm (for example, 1.5 μm). Subsequently, by ion etching or wet etching, the p-type electrode 112a is removed except below the stripe-shaped resist pattern 114 as shown in FIG. 2A. The p-type electrode 112a may instead be formed later, at the same time that a pad electrode 112b is formed later. In that case, on the wafer surface having the layered nitride semiconductor layer formed thereon as shown in FIG. 1B, the resist 114 is formed directly, and then the next step described below is performed.

Then, by dry etching such as RIE using $SiCl_4$ or $Cl_2$ gas, part of the upper clad layer 108 and the upper contact layer 109 located in the region where the resist 114 is not formed is removed to a certain depth to form a ridge stripe 110. Here, it is preferable that etching be stopped at a height 0.05 μm to 0.2 μm above, i.e. closer to the upper clad layer 108 relative to, the top surface of the evaporation prevention layer 106 in the layer thickness direction. As a result of this etching, the part of the upper contact layer 109 and the upper clad layer 108 located in the region below the resist 114 is left projecting relative to the other region, and this projecting part of the upper contact layer 109 and the upper clad layer 108 forms the ridge stripe 110. The ridge stripe 110 is formed away from the grooves 100 on the first principal plane of the n-type GaN substrate 101.

The reason is as follows. If etching is performed down to a height smaller than 0.05 μm above, i.e. closer to the upper clad layer 108 relative to, the top surface of the evaporation prevention layer 106, while the lasing threshold of the nitride semiconductor laser element lowers, the kink level becomes so low as to be unsuitable for high-output operation. By contrast, if etching is performed down only to a height larger than 0.2 μm above, i.e. closer to the upper clad layer 108 relative to, the top surface of the evaporation prevention layer 106, undesirably, the lasing threshold of the nitride semiconductor laser element becomes extremely high, and in addition it becomes difficult to control the optical characteristics, such as the far-field pattern (FFP), of the laser emitted.

When the ridge stripe 110 has been formed in this way, then, over the entire surface of the wafer having the ridge stripe 110 formed periodically as shown in FIG. 2A, a burying layer 111 of $SiO_2$ is formed with a thickness of 0.1 μm to 0.5 μpm (for example, 0.3 μm), in order to thereby bury the ridge stripe 110. Here, on the burying layer 111 formed of $SiO_2$, one or more layers for enhancing the adhesion to the later-described pad electrode 112b may be formed. This layer (or these layers) for enhancing the adhesion to the pad electrode 112b is formed of an oxide such as $TiO_2$, $ZrO_2$, $HfO_2$, or $Ta_2O_5$, or a nitride such as TiN, TaN, or WN, or a metal such as Ti, Zr, Hf, Ta, or Mo.

Subsequently, the resist formed on the ridge stripe 110 is dissolved with a solvent, and is then lifted off by ultrasonic cleaning or the like, so that, along with the resist 114, the burying layer 111 formed on the resist 114 is removed. As a result of this processing, as shown in FIG. 2C, while the burying layer 111 is left in the region other than where the ridge stripe 110 is formed, the surface of the p-type electrode 112a, which forms the top surface of the ridge stripe 110, is exposed. In a case where the p-type electrode 112a is not formed, when the resist 114 is dissolved, the surface of the upper contact layer 109, which forms the top surface of the ridge stripe 110, is exposed.

Forming a Pad Electrode

As a result of etching performed and the burying layer 111 being formed as described above, the wafer is now complete with the ridge stripe 110 buried by the burying layer 111 as shown in FIG. 2C. Then, by a photolithography process using resist, a pad electrode 112b, which will serve as a p electrode, is patterned. Here, as shown in FIG. 3A, the resist 120 is so patterned as to have openings 120a formed therein in a matrix-like formation, the openings 120a being each so shaped as to sufficiently cover the ridge stripe 110 with the ridge stripe 110 lying along the center line thereof. That is, in the resist 120, the openings 120a are formed, between adjacent grooves 100, discontinuously with respect to the direction in which the ridge stripe 110 extends.

Then, on the surface of the wafer thus having the resist 120 formed thereon, films of Mo/Au, W/Au, or the like are formed in that order by vapor deposition or the like so as to make contact with most of the p-type electrode 112a, in order to form a pad electrode 112b, which serves as a p electrode. In a case where the p-type electrode 112a is not formed before the formation of the ridge stripe 110, in this step of forming the pad electrode 112b, films of Ni/Au, Pd/Mo/Au, or the like are formed to serve as a p electrode via which to feed in electric power from outside.

Subsequently, the resist 120 is dissolved with a solvent and is then lifted off by ultrasonic cleaning or the like so that, along with the resist 120, the metal films formed on the resist 120 are removed. In this way, the pad electrode 112b is formed with the same shape as the opening 120a in the resist 120. The pattern of the opening 120a in the resist 120 may be given the desired shape with consideration given to the wire bonding region etc.

If the pad electrode 112b is formed to lie close to the splitting surfaces at which the wafer is split into individual nitride semiconductor laser elements 10 (see FIG. 5), or close to the locations where the later-described trenches 115 are formed in the succeeding step, current leakage or electrode exfoliation may result. This is the reason that the pad electrode 112b is patterned as described above. The pad electrode 112b may be patterned by etching. In that case, metal films that will serve as a p electrode are vapor-deposited over the entire surface of the wafer structured as shown in FIG. 2C; subsequently, by photolithography, the part of the metal films to be left as the pad electrode 112b is protected with resist, and then the metal films are patterned with, for example, an aqua regia based etchant; thus the pad electrode 112b is formed.

Forming Trenches Beside the Ridge Stripe

After the formation of the pad electrode 112b as described above, next, trenches are formed that prevent a surface irregularity that develops in the vicinity of the active layer from developing on a cleavage surface of the nitride semiconductor laser element 10 (see FIG. 5). First, as shown in the top view in FIG. 3B, by photolithography, resist 121 is laid that has openings 121a in regions at both sides of the ridge stripe 110 where the pad electrode 112b is not located. With the resist 121 laid in this way, the nitride semiconductor layer can be carved by dry etching at the openings 121a. Here, the burying layer 111, which is formed of $SiO_2$, is removed by dry etching or wet etching, and subsequently the nitride semiconductor layer below the burying layer 111 is carved by dry etching, so that trenches 115 are formed, as carved regions, at the openings 121a.

Furthermore, on the wafer surface thus carved at the openings 121a of the resist 121, $SiO_2$ is vapor-deposited by sputtering or the like to form a film of $SiO_2$ with a thickness of about 0.15 μm. Then, from the wafer thus having the $SiO_2$ film formed thereon, the resist 121 is dissolved with a solvent and is then lifted off by ultrasonic cleaning or the like so that, along with the resist 121, the $SiO_2$ film formed on the resist 121 is removed. As a result, in the carved regions at the openings 121a, the $SiO_2$ film is left as a protective layer 116 as shown in the cross-sectional view in FIG. 4. This protective layer 116 serves to protect the etched floor and side surfaces in the trenches 115 formed as carved regions at the openings 121a.

Owing to the formation of the trenches 115 coated with the protective layer 116, even if a parallel surface irregularity 517 (see FIGS. 12, 13A, 13B, and 14) near the active layer 105 develops due to shell-shaped steps 531 (see FIG. 14) that develop at the time of cleaving due to a surface irregularity of the order of microns that develops on the wafer surface due to the grooves 100 in the n-type GaN substrate 101, the surface irregularity 517 is prevented from reaching the vicinity of the ridge stripe 110. This is achieved because the trenches 115 are located in front of the ridge stripe 110 with respect to the transmission direction of the shock wave from a surface irregularity or the like of the order of microns that develops on the wafer surface at the time of cleaving.

That is, although a shock wave that appears parallel to the nitride semiconductor layer produces a surface irregularity that runs parallel to the nitride semiconductor layer near the active layer 105, the trenches 115 prevent the transmission of the shock wave and thereby interrupt the surface irregularity 517. Thus, unless steps are formed between the trenches 115 and the ridge stripe 110 at the time of cleaving, the incidence of a surface irregularity 517 that runs parallel to the nitride semiconductor layer near the active layer 105 can be greatly reduced between the trenches 115 and the ridge stripe 110.

When the trenches 115 are formed in this way, it is preferable that they be so formed that, of the openings 121a in the resist 121 for forming the trenches 115, the edges 121b closest to the ridge stripe 110 along the intended splitting lines 125 at which cleaving will be performed to form mirror facets are located 2 μm or more away from the edges 110a (see FIG. 4) of the ridge stripe 110. If the edges 121b of the openings 121a are located 2 μm or less away from the ridge stripe 110, the structure of the trenches 115 formed at the openings 121a influences the optical characteristics of the nitride semiconductor laser element 10 (see FIG. 5).

Moreover, the openings 121a of the resist 121 are formed at a distance of 100 μm or less from the edges 110a (see FIG. 4) of the ridge stripe 110 so that no large surface irregularities, such as those influenced by the grooves 100, develop on the wafer surface between the edges 121b of the openings 121a and the ridge stripe 110. This is because, if the trenches 115 are formed with the openings 121a located at a distance of 100 μm or more from the ridge stripe 110, depending on the largeness of a surface irregularity and the distance between the surface irregularity and the ridge stripe 110, it is more likely that shell-shaped steps 531 newly develop between the trenches 115 and the ridge stripe 110. In a case where there is a large surface irregularity on the wafer surface between the openings 121a at which the trenches 115 are formed and the ridge stripe 110, the trenches 115 do not exert their intended effects.

Furthermore, it is preferable that the unetched thickness L2, i.e. the distance from the top surface of the evaporation prevention layer 106 to the bottom surface of the trenches 115, be less than 0.05 μm on at least part of the intended splitting lines 125. It is further preferable that the unetched thickness L2, i.e. the distance from the top surface of the evaporation prevention layer 106 to the bottom surface of the trenches 115, be in the range from 0 μm to −0.3 μm. Here, when the unetched thickness L2 has a negative value, it means that, when the trenches 115 are carved, the carving is performed to reach a layer lower than the top surface of the evaporation prevention layer 106.

This is because, through the investigations described earlier, it has been confirmed that, when the unetched thickness L1 left when the ridge stripe 510 is formed in the conventional nitride semiconductor laser element 50 (see FIG. 11) is less than 0.05 μm, it is less likely that a surface irregularity 517 develops in the vicinity of the active layer 505. That is, forming the trenches 115 means forming regions where the unetched thickness L2 is less than 0.05 μm in front of the ridge stripe 110 with respect to the direction in which a shock wave runs at the time of cleaving, and thus the regions where the trenches 115 are formed eliminate a surface irregularity 517 that has developed on a mirror facet near the active layer 105.

When there is left a certain unetched thickness, a shock wave is expected to run in different manners in the layers above and below the active layer 105. Thus, when the unetched thickness L2 is less than zero, the trenches 115 can completely eliminate a parallel surface irregularity near the active layer 105. On the other hand, if the trenches 115 themselves are made deeper, their corners become a new cause of development of a parallel surface irregularity. Hence, it is preferable that the trenches 115 be formed down to about 0.5 μm below the evaporation prevention layer 106.

Figure 4:
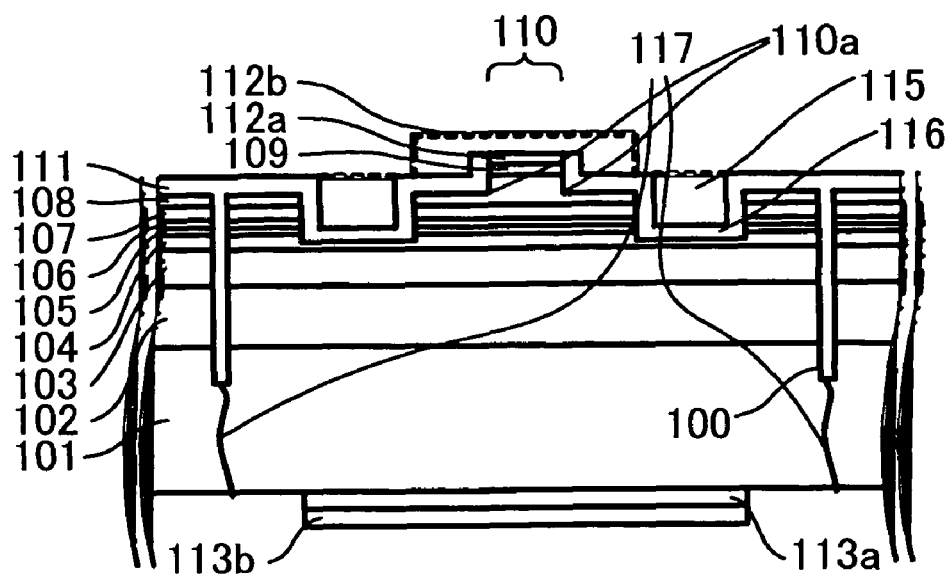
FIG. 4 is a cross-sectional view of a wafer, illustrating the fabrication procedure of a nitride semiconductor laser element according to the present invention.
Figure 5:
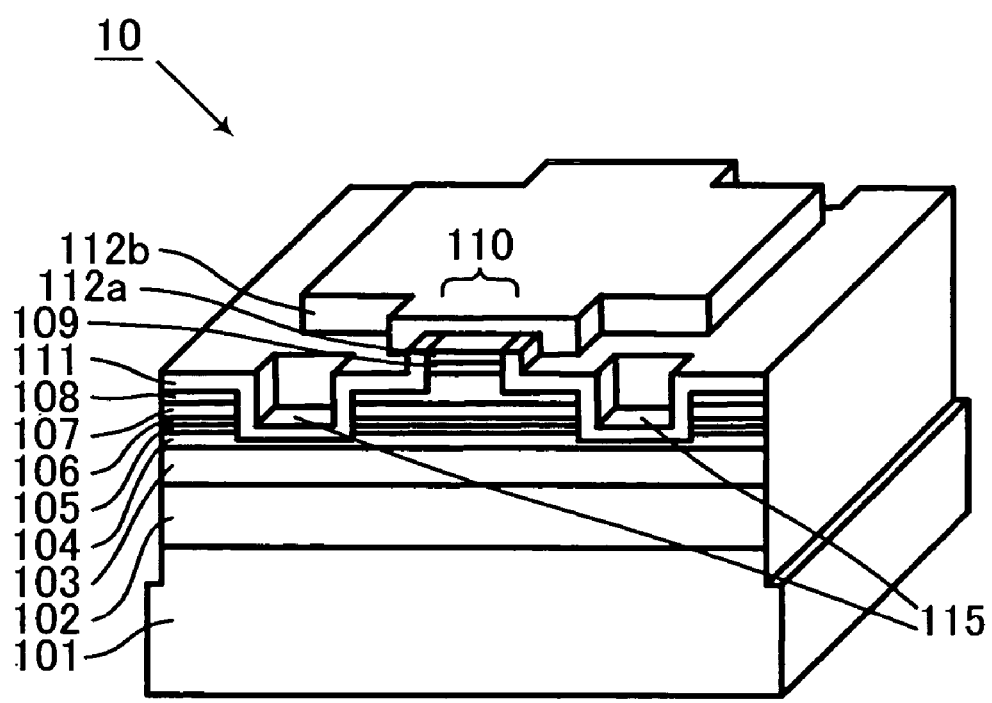
FIG. 5 is an exterior perspective view of the nitride semiconductor laser element of Example 1 of the present invention.

It is preferable that the trenches 115 be formed at both sides of the ridge stripe 110 as shown in FIG. 4. Usually, when cleaving is performed, a splitting groove is formed at the edge of the wafer having the nitride semiconductor layer formed thereon, and a shock wave of cleaving is propagated starting at that splitting groove. Thus, when one of the trenches 115 is located in front of the ridge stripe 110 with respect to the direction in which a shock wave is propagated at the time of cleaving (i.e. when it is formed between a splitting groove and the ridge stripe 110), the intended effects of the present invention are achieved.

In some cases, however, a splitting groove is also formed in a middle part of the wafer to prevent an unexpected deviation in bar width (a deviation in laser cavity length) during the splitting of the wafer into bars. In these cases, a shock wave is not always propagated in a fixed direction. In such cases, to surely prevent development of a parallel surface irregularity 517 near the active layer 105 and thereby improve yields, the trenches 115 need to be formed at both sides of the ridge stripe 110.

In this embodiment, the trenches 115 are formed only in the vicinity of the ridge stripe 110 on the intended splitting lines 125, and are formed at locations corresponding to the four corners of the nitride semiconductor laser element 10 (see FIG. 5). Alternatively, the trenches 115 may be formed by etching the entire surface except in the vicinity of the ridge stripe 110 so as to fulfill the conditions stated previously, or may be so shaped as to have stripe-shaped etched portions parallel to the ridge stripe 110. In a case where the trenches 115 are formed in the shape of stripes in this way, prior to the formation of the pad electrode 112b, the trenches 115 need to be buried with an insulating film.

Alternatively, the trenches 115 may be formed prior to the formation of the ridge stripe 110. In that case, there is no need to etch the burying layer 111 or to form the protective layer 116 in the trenches 115. This helps reduce the number of steps for fabricating the nitride semiconductor laser element. Moreover, if there is little risk of current leakage to the trenches 115, it is possible to omit the protective layer 116 in the trenches 115; conversely, it is also possible to form the protective layer 116 so thick as to completely fill the trenches 115.

Forming an N-side Electrode

When the trenches 115 have been formed as described above, then the bottom surface of the wafer having the trenches 115 formed therein (i.e. the bottom face of the n-type GaN substrate 101) is polished or ground until the wafer has a thickness of 60 μm to 150 μm (for example, 100 μm). Then, as shown in FIG. 4, on the thus polished or ground bottom surface of the wafer (i.e. the polished or ground surface), films of Hf/Al or Ti/Al are formed in this order by vapor deposition or the like to form an n electrode 113a. Moreover, the n electrode 113a is subjected to heat treatment to guarantee the ohmic characteristics thereof. Furthermore, a pad electrode 113b for facilitating the mounting of the nitride semiconductor laser element 10 (see FIG. 5) is formed by vapor-depositing a film of a metal such as Au so as to cover the n electrode 113a.

Forming Mirror Facets

Having the n electrode 113a and the pad electrode 113b formed on the bottom surface thereof as described above, the wafer is then cleaved in the direction approximately perpendicular to the ridge stripe 110 so that the wafer is split into a plurality of bars each having a width of 250 μm to 1 000 μm (for example, 650 μm), which width will count as a cavity length, and that the cleavage surfaces form mirror facets. Since the wafer is thin, it can be cleaved easily. This cleaving into bars is generally achieved by a scribe-and-break process, a laser scribing-based breaking process, or the like.

Then, film formation is performed on the mirror facets at both sides of each bar having a plurality of nitride semiconductor laser elements 10 (see FIG. 5) arrayed in a row thereon. Specifically, on the rear-side mirror facet, a high-reflection film (unillustrated) composed of two or more layers laid together is formed; on the front-side mirror facet, a low-reflection film (unillustrated) composed of one or more layers laid together is formed. Owing to this structure, in each nitride semiconductor laser element 10 (see FIG. 5) split from the bar, the laser light produced by excitation inside it is emitted through the front-side mirror facet.

Forming Laser Chips

Each bar thus having reflective films formed on the mirror facets thereof is then further split into individual chips each having a width of about 200 μm to 300 μm. In this way, the nitride semiconductor laser element 10 with the shape as shown in the exterior perspective view in FIG. 5 is fabricated. Here, for example, the splitting is performed so that the ridge stripe 110 is located in a middle part of the nitride semiconductor laser element 10; that is, the splitting is performed with the splitting positions so located as not to influence the ridge stripe 110.

The chip width with which the splitting into individual nitride semiconductor laser elements 10 is performed is adequately determined according to the period with which the grooves 100 are formed in the n-type GaN substrate 101. Furthermore, in the nitride semiconductor laser element 10 thus split, the nitride semiconductor layer formed at and above the grooves 100 in the n-type GaN substrate 101 may be cut off.

The nitride semiconductor laser element 10 thus obtained by being split as described above is then mounted on a stem, and then wires leading from outside are connected to the pad electrode 112b, which serves as a p electrode, and the pad electrode 113b, which serves as an n electrode. Then, to seal the nitride semiconductor laser element 10 mounted on the stem, a cap is put to enclose the stem. Now, the nitride semiconductor laser element is complete as a nitride semiconductor laser device.

With samples of the nitride semiconductor laser element 10 thus fabricated by splitting the wafer having the trenches 115 formed therein, evaluations of their characteristics were performed, of which the results will be presented below. In the examples described below, more specific examples of the structure of the nitride semiconductor laser element 10 and the results of the evaluation of their characteristics will be presented.

EXAMPLE 1

An outline of the structure of the nitride semiconductor laser element 10 of this example is shown in an exterior perspective view in FIG. 5. The structure of this nitride semiconductor laser element 10 will be described below by way of its fabrication procedure.

In the nitride semiconductor laser element 10 of this example, in the surface of the n-type GaN substrate 101, grooves 100 were formed at intervals of 400 μm so as to be located above defect-concentrated regions 117. Then, on the first principal plane of the n-type GaN substrate 101 thus having the grooves 100 formed at intervals of 400 μm therein, the following layers were formed one after another in the order named: an n-type GaN lower contact layer 102 with a thickness of 2.5 μm; an n-type $Al_{0.05}Ga_{0.95}N$ lower clad layer 103 with a thickness of 3.0 μm; an active layer 105 composed of alternately laid quantum well layers of $In_{x1}Ga_{1-x1}N$ and barrier layer of $In_{x2}Ga_{1-x2}N$ (where x 1>x2); a p-type $Al_{0.3}Ga_{0.7}N$ evaporation prevention layer 106 with a thickness of 0.01 μm; a p-type $Al_{0.05}Ga_{0.95}N$ upper clad layer 108 with a thickness of 0.5 μm; and a p-type GaN upper contact layer 109.

Subsequently, a p electrode 112a of Pd was formed on the surface of the p-type GaN upper contact layer 109, and then the upper clad layer 108 and the upper contact layer 109 were etched to form a ridge stripe 110 with a width of 1.5 μm. Here, the etching was so performed that the unetched thickness L1 from the etched floor surface in the upper clad layer 108 to the top surface of the evaporation prevention layer 106 was 0.08 μm. Then, the ridge stripe 110 was buried with a 0.2 μm thick burying layer 111 of $SiO_2$, and then Mo/Au films were patterned to form a pad electrode 112b, which would serve as a p electrode. Thereafter, on intended splitting lines 125 (see FIG. 4), trenches 115 were formed 50 μm away from the ridge stripe 110, the trenches 115 measuring 30 μm by 30 μm, being 0.25 μm deep, and being buried with 0.2 μm thick $SiO_2$. The interval of the intended splitting lines 125, which would count as the cavity length of the nitride semiconductor laser element 10, was 650 μm.

Having the nitride semiconductor layer formed on and the trenches 115 formed in the n-type GaN substrate 101 in this way, the wafer was then polished or grounded on the bottom surface thereof until it had a thickness of 100 μm. Then, an n electrode 113a and a pad electrode 113b were formed. Then, with a splitting groove formed at the edge of the wafer, the wafer was cleaved along the intended splitting lines 125 so as to be split into bars each having a width equal to the cavity length. At this stage, the mirror facets, i.e. the mirror facets of individual nitride semiconductor laser elements 10 still lying one continuous with the next, were inspected under an electronic microscope. On these mirror facets, no development of a surface irregularity 517 (see FIGS. 12, 13A, 13B, and 14) was observed.

After the above-described splitting into bars each having a width equal to the cavity length, on the front-side and rear-side mirror facets of each split bar, low- and high-reflection coatings (unillustrated) were respectively formed, and then each bar was further split along the grooves 100 in the n-type GaN substrate 101 so as to be formed into separate chips. In this way, the nitride semiconductor laser element 10 was fabricated. The nitride semiconductor laser element 10 was then mounted on a stem so as to be formed into a nitride semiconductor laser device, which was then operated. This nitride semiconductor laser device lased at a threshold current of 30 mA, at a slope efficiency of 1.5 W/A, and at a wavelength of 405 nm. Furthermore, when the nitride semiconductor laser device was operated up to a high output, it yielded a sufficient output to offer the desired reliability, and did not suffer failure resulting from a parallel surface irregularity 517 near the active layer 105 as conventionally experienced.

EXAMPLE 2

Figure 6:
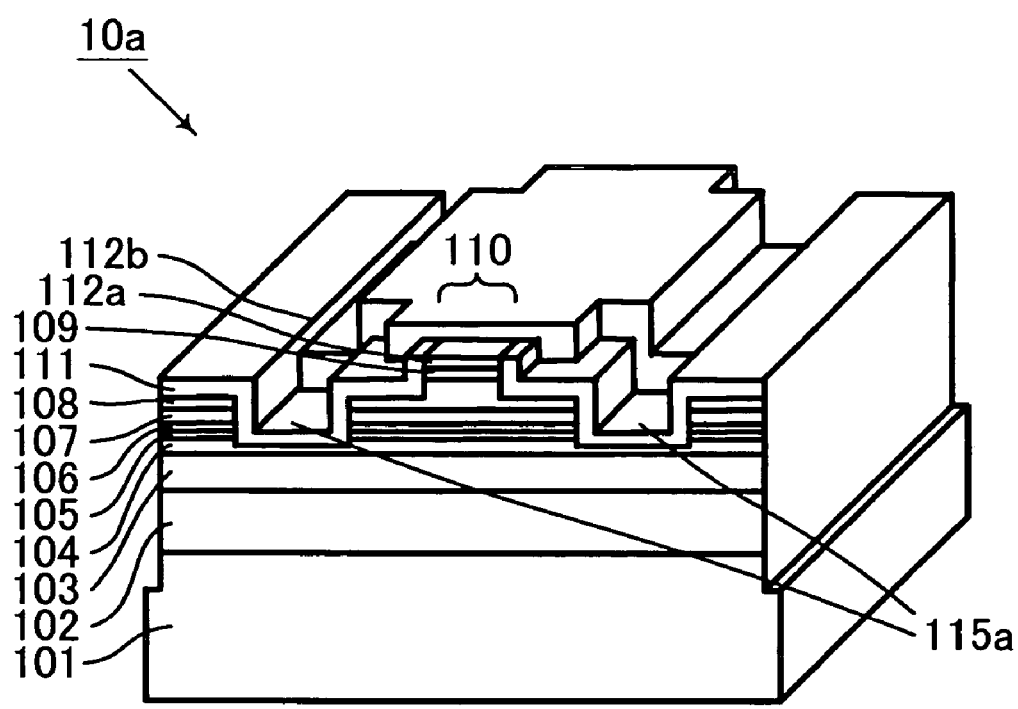
FIG. 6 is an exterior perspective view of the nitride semiconductor laser element of Example 2 of the present invention.

An outline of the structure of the nitride semiconductor laser element 10a of this example is shown in an exterior perspective view in FIG. 6. The structure of this nitride semiconductor laser element 10a will be described below by way of its fabrication procedure. In the structure of the nitride semiconductor laser element 10a shown in FIG. 6, such parts as are found also in the nitride semiconductor laser element 10 shown in FIG. 5 are identified with common reference numerals, and no detailed explanation thereof will be repeated. In this example, unlike Example 1, instead of the trenches 115, stripe-shaped trenches 115a are formed in the wafer.

In the nitride semiconductor laser element 10a of this example, the interval between the grooves 100 formed in the n-type GaN substrate 101 was 300 μm, and, on the first principal surface of the n-type GaN substrate 101, the following layers were formed one after another in the order named: an n-type GaN lower contact layer 102 with a thickness of 2.5 μm; an n-type $Al_{0.05}Ga_{0.95}N$ lower clad layer 103 with a thickness of 3.0 μm; an active layer 105 composed of alternately laid quantum well layers of $In_{x1}Ga_{1-x1}N$ and barrier layer of $In_{x2}Ga_{1-x2}N$ (where x1>x2); a p-type $Al_{0.3}Ga_{0.7}N$ evaporation prevention layer 106 with a thickness of 0.01 μm; a p-type $Al_{0.05}Ga_{0.95}N$ upper clad layer 108 with a thickness of 0.5 μm; and a p-type GaN upper contact layer 109.

Subsequently, a p electrode 112a of Pd was formed, and then etching was performed parallel to the grooves 100 to form stripe-shaped trenches 115a with a depth of 0.2 μm. Here, the trenches 115a were formed 5 μm to both the left and right of the center lines between the grooves 100 formed at intervals of 300 μm, with each trench given a width of 15 μm. These trenches 115a were not buried with $SiO_2$ immediately after the etching, because they were going to be buried in a later step for forming a burying layer 111.

The wafer thus having the trenches 115a formed therein was further etched to form a ridge stripe 110 with a width of 1.5 μm so that the unetched thickness L1 was 0.08 μm. Here, the ridge stripe 110 was formed between grooves 100, between trenches 115a; more precisely, the ridge stripe 110 was formed at the middle between the grooves 100 located direct to both sides of the ridge stripe 110, at the middle between the trenches 115a located direct to both sides of the ridge stripe 110.

Then, the ridge stripe 110 and the trenches 115a thus formed were buried with a 0.2 μm thick $SiO_2$ burying layer 111. Thereafter, Mo/Au films were patterned to form a pad electrode 112b, which would serve as a p electrode. Here, the trenches 115a were additionally etched by the dry etching performed to form the ridge stripe 110, with the result that the unetched thickness L2 at the floor of the trenches 115a (in this example, the distance from the floor surface of the trenches 115a to the top surface of the evaporation prevention layer 106) was −0.12 μm.

The thickness of the wafer thus having the nitride semiconductor layer formed on the n-type GaN substrate 101, with the trenches 115a formed in the nitride semiconductor layer, was then adjusted to be 100 μm, and then an n electrode 113a and a pad electrode 113b were formed. Then, with a splitting groove formed at the edge of the wafer, the wafer was split into bars each having a width of 600 μm, which was equal to the cavity length. At this stage, the mirror facets were inspected under an electronic microscope. As with the nitride semiconductor laser element 10 of Example 1, no development of a surface irregularity near the active layer 105 was observed.

Then, on the front-side and rear-side mirror facets of each split bar, low- and high-reflection coatings (unillustrated) were respectively formed, and then each bar was further split along the grooves 100 in the n-type GaN substrate 101 so as to be formed into separate chips. In this way, the nitride semiconductor laser element 10a was fabricated. The nitride semiconductor laser element 10a was then mounted on a stem so as to be formed into a nitride semiconductor laser device, which was then operated. This nitride semiconductor laser device lased at a threshold current of 30 mA, at a slope efficiency of 1.5 W/A, and at a wavelength of 405 nm. Furthermore, when the nitride semiconductor laser device was operated up to a high output, like the nitride semiconductor laser element 10 of Example 1, it yielded a sufficient output to offer the desired reliability, and did not suffer failure resulting from a parallel surface irregularity 517 near the active layer 105 as conventionally experienced.

EXAMPLE 3

Figure 7:
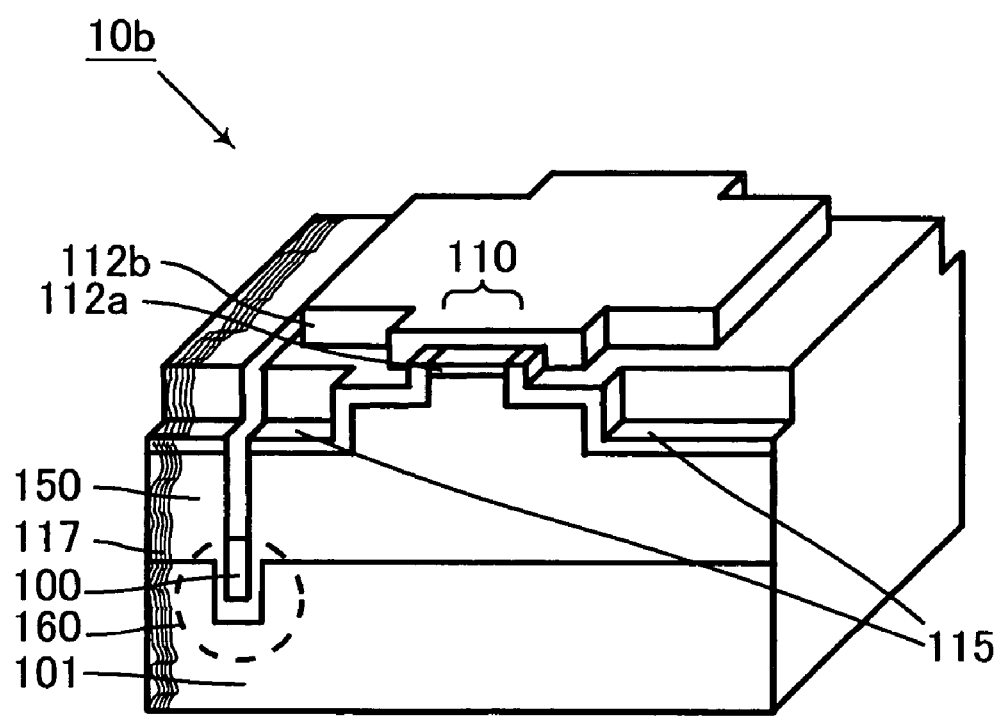
FIG. 7 is an exterior perspective view of the nitride semiconductor laser element of Example 3 of the present invention.

An outline of the structure of the nitride semiconductor laser element 10b of this example is shown in an exterior perspective view in FIG. 7. The structure of this nitride semiconductor laser element 10b will be described below by way of its fabrication procedure. In the structure of the nitride semiconductor laser element 10b shown in FIG. 7, such parts as are found also in the nitride semiconductor laser element 10 shown in FIG. 5 are identified with common reference numerals, and no detailed explanation thereof will be repeated.

In the nitride semiconductor laser element 10b of this example, an n-type GaN substrate 101 was used in which defect-concentrated regions and low-defect regions were arranged alternately at intervals of 400 µm. First, on the surface of the n-type GaN substrate 101, grooves 100 having a width of about 5 µm were formed at intervals of about 80 µm and with a depth of about 3 µm so as to be located on both sides of the defect-concentrated regions 117 arranged at intervals of about 400 µm. As a result of this processing, the grooves 100 recurred in pairs at intervals of about 80 µm and about 320 µm on the wafer.

Figure 8:
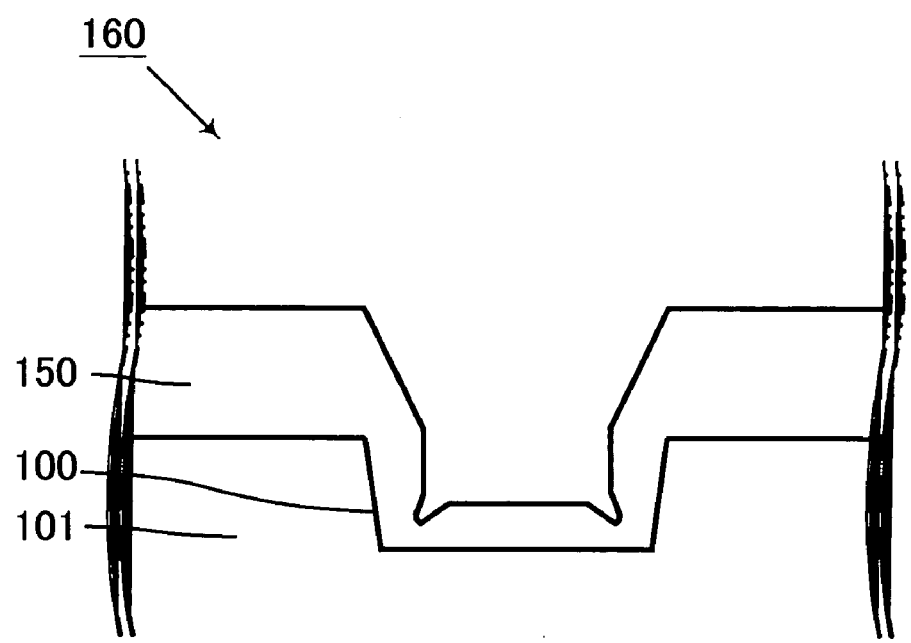
FIG. 8 is an enlarged cross-sectional view around a groove in an n-type GaN substrate having a nitride semiconductor layered structure formed thereon.

On the primary principal plane of the n-type GaN substrate 101 thus having grooves 100 formed therein, a nitride semiconductor layered structure 150 was formed. The contents of the nitride semiconductor layered structure 150 were the same as the nitride semiconductor layers 102 to 109 in Example 1. FIG. 8 is an enlarged cross-sectional view around a groove 101 in the n-type GaN substrate 101 having the nitride semiconductor layered structure 150 formed thereon. As shown in FIG. 8, even after the nitride semiconductor layered structure 150 is formed, the grooves 100 are not filled, but may even become deeper eventually. This makes the development of a parallel surface irregularity near the active layer more likely.

Figure 9:
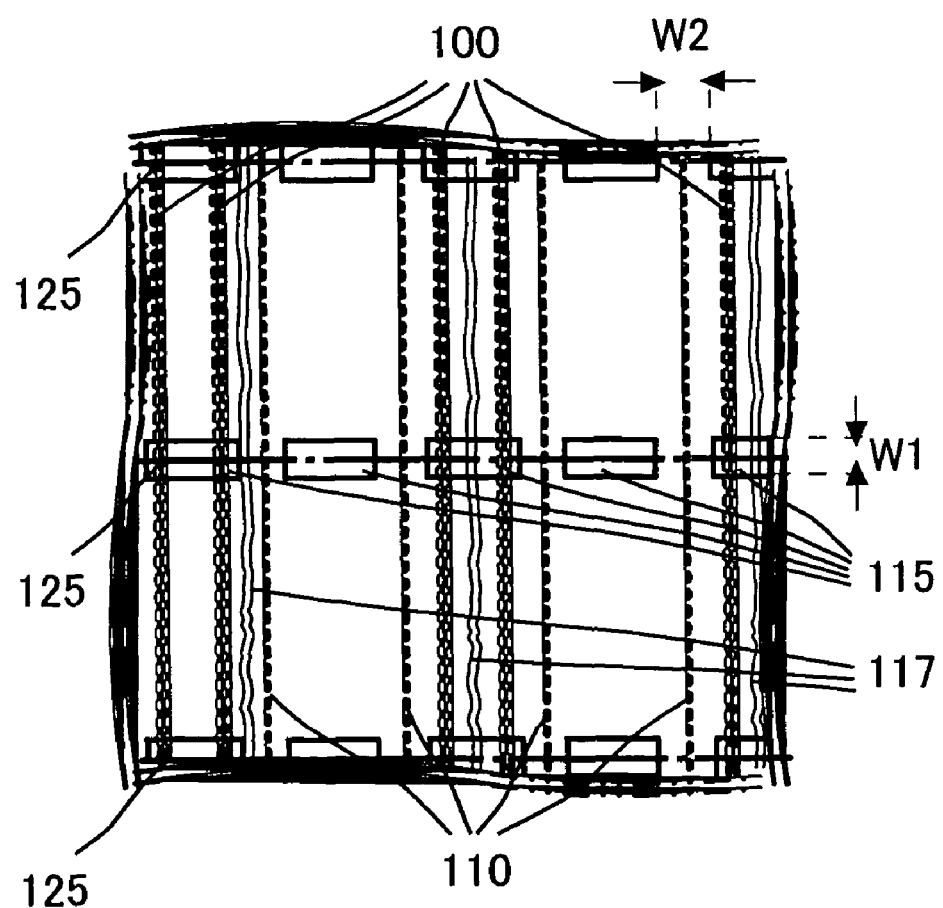
FIG. 9 is a top view of a wafer, illustrating the fabrication procedure of the nitride semiconductor laser element of Example 3 of the present invention.

Subsequently, as shown in FIG. 9, a p electrode 112a formed of Pd was formed on the surface of the p-type GaN upper contact layer 109, and then, along the intended splitting lines 125 running in the direction perpendicular to the grooves 100, dry etching was performed in the shape of stripes with a width W1 of 50 µm in the direction parallel to the grooves 100; thus, a plurality of trenches 115 were formed with a depth of 0.25 µm. Here, the trenches 115 were formed so that the distance W2 between adjacent trenches 115 on the same intended splitting line 125 was 70 µm; thus, a ridge stripe 110 was formed between adjacent trenches 115. Incidentally, the 70 µm unetched region between the trenches 115 was so adjusted as to be formed in a low-defect region and was so located as to be at least 50 µm away from the grooves 100. This is because, near the grooves 100, the nitride semiconductor layered structure 150 is subject to disturbance.

On the wafer thus having the trenches 115 formed therein, further dry etching was performed to form a 1.5 µm wide ridge stripe 110 parallel to the grooves 100. This ridge stripe 110 was so formed as to be located substantially at the middle of the 70 µm unetched region where no trenches 115 were formed. In this example, the unetched thickness L1 from the etched floor surface in the upper clad layer 108 to the top surface of the evaporation prevention layer 106 was 0.06 µm.

Then, the ridge stripe 110 and the trenches 115 were buried with a 0.2 µm thick SiO$_2$ burying layer 111, and then Mo/Au films were patterned to form a pad electrode 112b, which would serve as a p electrode. Here, the trenches 115 were additionally etched by the dry etching performed to form the ridge stripe 110, so that the unetched thickness L2 at the floor of the trenches 115 (the distance from the floor surface of the trenches 115 to the top surface of the evaporation prevention layer 106) was about –0.19 µm.

The thickness of the wafer thus formed was then adjusted to be 130 µm, and then an n electrode 113a and a pad electrode 113b (unillustrated) were formed. Then, the wafer was split into bars each having a width of 415 µm, which was equal to the cavity length. At this stage, the mirror facets of individual nitride semiconductor laser elements 10 still lying one continuous with the next were inspected under an electronic microscope. As with the nitride semiconductor laser element 10 of Example 1, no development of a parallel surface irregularity near the active layer 105 was observed.

Then, on the front-side and rear-side mirror facets of each split bar, low- and high-reflection coatings (unillustrated) were respectively formed, and then each bar was further split so as to be formed into separate chips. In this way, the nitride semiconductor laser element 10b was fabricated. The nitride semiconductor laser element 10b was then mounted on a stem so as to be formed into a nitride semiconductor laser device, which was then operated. This nitride semiconductor laser device lased at a threshold current of 25 mA, at a slope efficiency of 1.0 W/A, and at a wavelength of 405 nm. Furthermore, when this nitride semiconductor laser element 10b was operated up to a high output, it yielded a sufficient output to offer the desired reliability, and did not suffer failure resulting from a parallel surface irregularity 517 near the active layer 105 as conventionally experienced.

In the nitride semiconductor laser element 10b of this example, unlike the nitride semiconductor laser elements 10 and 10a of Examples 1 and 2 described previously, on the n-type GaN substrate 101, the grooves 100 are formed in regions that do not include the defect-concentrated regions 117. Even with the structure of this example, however, as with the nitride semiconductor laser elements 10 and 10a of Examples 1 and 2, it is possible to reduce the development of cracks, and to obtain as long laser lifetimes.

EXAMPLE 4

Figure 10:
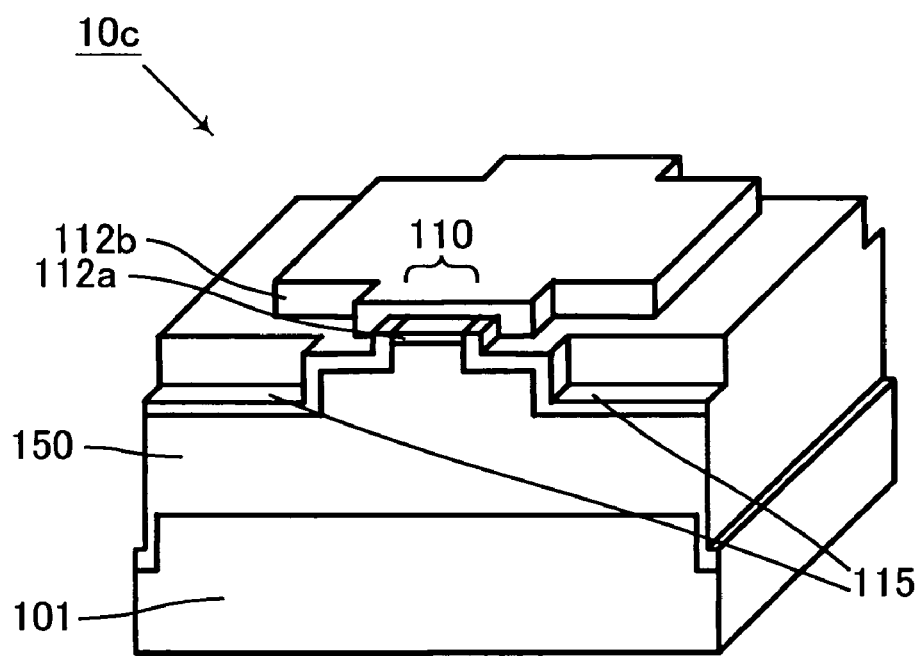
FIG. 10 is an exterior perspective view of the nitride semiconductor laser element of Example 4 of the present invention.

An outline of the structure of the nitride semiconductor laser element 10c of this example is shown in an exterior perspective view in FIG. 10. In the structure of the nitride semiconductor laser element 10c shown in FIG. 10, such parts as are found also in the nitride semiconductor laser elements 10 and 10b shown in FIGS. 5 and 7 are identified with common reference numerals, and no detailed explanation thereof will be repeated. In this example, the trenches 115 are assumed to have the same shape as in Example 3.

In the nitride semiconductor laser element 10c of this example, an n-type GaN substrate 101 having no defect-concentrated regions is used, and grooves 100 are formed at intervals of 200 µm. Then, on this n-type GaN substrate 101, as in the nitride semiconductor laser element 10 of Example 1, a nitride semiconductor layered structure 150 is grown. Subsequently, in similar manners as when the nitride semiconductor laser element 10b of Example 3 is fabricated, trenches 115 and a ridge stripe 110 are formed, and then pad electrodes 112b and 113b are patterned. Thereafter, the wafer is cleaved along the intended splitting lines 125 so as to be split into bars. Then, on the front-side and rear-side mirror facets of each split bar, low- and high-reflection coatings are respectively formed, and then each bar is further split into chips; in this way, the nitride semiconductor laser element 10c is fabricated.

An analysis of the thus fabricated nitride semiconductor laser element 10c demonstrated that, as with the nitride semiconductor laser element 10 of Example 1, no parallel surface irregularity near the active layer 105 was observed. Moreover, when this nitride semiconductor laser element 10b was mounted on a stem so as to be fabricated into a nitride semiconductor laser device, and was then operated, no failure resulting from a parallel surface irregularity 517 near the active layer 105 was observed.

Even in Examples 3 and 4, where the grooves 100 are not formed above defect-concentrated regions, their width and depth may be varied thanks to increased flexibility in design resulting from the formation of the trenches 115. Specifically, even when the width and depth of the grooves 100 are changed from those specifically mentioned in connection with Example 3 (5 μm wide and 3 μm deep), so long as the grooves 100 are not filled by the growth of the nitride semiconductor layers, the same effects can be obtained as in Examples 1 and 2. Specifically, the groove width may be freely varied in the range from about 2 μm to about 100 μm, and the groove depth from about 1 μm to about 10 μm.

The process of forming the grooves 100 may be performed after the growth of part of the nitride semiconductor layered structure 150. In particular, forming the grooves 100 before the growth of the active layer 105 makes it possible to partly obtain the effects mentioned previously in connection with Examples 1 and 2. Incidentally, in the grooves 100, even on the floor and side surfaces thereof, the nitride semiconductor is deposited. Thus, in a case where the grooves 100 are formed after the growth of part of the nitride semiconductor layers, the ultimate cross-sectional shape of the grooves 100 varies depending on the nitride semiconductor layers that are grown after the formation of the grooves 100. Even in this case, where the grooves 100 are formed after the growth of part of the nitride semiconductor layered structure 150, forming the trenches 115 makes it possible to obtain the effects mentioned above.

With respect to the trenches 115, to obtain the above-mentioned effects with an ample margin even when the wafer is split along splitting lines deviated from the intended splitting lines 125, it is advisable that the trenches 115 be given as large a width W1 as possible. Specifically, if the trenches 115 are given a width W1 of 10 μm or less, it is difficult to accurately align the splitting lines, and thus the actual splitting lines fall outside the regions of the trenches 115, often making it impossible to sufficiently obtain the effects of providing the trenches 115. If the trenches 115 are given a width W1 of 30 μm, it is possible to accurately control the splitting indeed, but, when errors in mask alignment relative to the intended splitting lines 125 and other errors are taken into consideration, lower yields may result. By contrast, if the trenches 115 are given a width W1 of 40 μm or more, even when errors in mask alignment relative to the intended splitting lines 125 and other errors are taken into consideration, it is possible to achieve better yields in element fabrication.

From a different perspective, to secure an electrode region so that the electrode 112b is not deposited in the trenches 115, reducing the width W1 of the trenches 115 helps increase flexibility in design. The size of the region needed for the electrode 112b depends on the cavity length of the nitride semiconductor laser element to be fabricated; the smaller the cavity length is, the smaller the width W1 of the trenches 115 needs to be made. For example, when nitride semiconductor laser elements are fabricated with a cavity length of 300 μm, it is preferable that the trenches 115 be given a width W1 of 60 μm or less.

Out of the above considerations, in the nitride semiconductor laser elements 10b and 10c of examples 3 and 4 structured as described above, the trenches 115 are given a width W1 of 50 μm. It is preferable that the trenches 115 be given a width of 10 μm or more but 100 μm or less, more preferably 30 μm or more but 80 μm or less, and particularly preferably 40 μm or more but 60 μm or less. Incidentally, the distance W2 (in Example 3, 70 μm) between adjacent trenches 115 on the same intended splitting line 125 may be freely designed according to their previously mentioned relationship with the ridge stripe 110.

In nitride semiconductor laser elements according to the present invention, including those of the examples described above, the depth of the trenches 115 is determined with reference to the top surface of the evaporation prevention layer 106. In a case where no evaporation prevention layer 106 is provided, the top surface of the active layer 105 may be used as the reference. Moreover, with respect to the structure of the nitride semiconductor laser element 10, a double-channel shape may be adopted in which unetched regions of the nitride semiconductor layered structure 150 are left on both sides of a ridge. This structure helps prevent the ridge stripe 110 from being damaged in the fabrication process. Even in this case, trenches 115 can be formed between the grooves 100 and the ridge stripe 110.

The effects of nitride semiconductor laser elements according to the present invention can be obtained not only with grooves formed as surface irregularities of the order of microns in a wafer, but also with surface irregularities formed when an n electrode is formed on the top surface, or with various kinds of surface irregularity needed for the growth of a nitride semiconductor layer. Thus, not only in nitride semiconductor laser elements having a nitride semiconductor layer grown on a nitride semiconductor substrate, but also in those having them grown on a substrate of other than a nitride semiconductor, such as a sapphire substrate, it is possible to reduce the influence of surface irregularities that develop on the wafer surface during the growth, and thereby to alleviate the development of surface irregularities on mirror facet at the time of cleaving. The effects can be obtained, conversely, also when the substrate has defect-concentrated regions instead of surface irregularities.

Nitride semiconductor laser elements according to the present invention can be applied to nitride semiconductor laser devices used in light source apparatuses such as optical pickups. Specifically, nitride semiconductor laser elements according to the present invention can be applied, for example, even to broad area semiconductor laser devices for illumination which, while not requiring strict restrictions on the control of optical characteristics such as the FFP, yield outputs as high as several watts. Specifically, since they yield high outputs, broad area semiconductor laser devices place a heavy burden on the mirror facets of nitride semiconductor laser elements, and thus essentially require that there be no surface irregularity on the mirror facets as in nitride semiconductor laser elements according to the present invention. Accordingly, forming trenches beside the ridge stripe of the nitride semiconductor laser element used in a broad area semiconductor laser device is expected to help prevent surface irregularities and enhance reliability. In such a broad area semiconductor laser device, it is advisable that the ridge stripe of the nitride semiconductor laser element be given a width of 5 μm to 100 μm.

Nitride semiconductor laser elements according to the present invention can be applied not only to nitride semiconductor laser elements having a stripe-shaped waveguide in the shape of a ridge as described above, but also to nitride semiconductor laser elements having a stripe-shaped waveguide other than in the shape of a ridge, such as a stripe-shaped waveguide of a BH type, a RiS type, or any other type. In a nitride semiconductor laser element of a BH type, it is advisable that the unetched thickness from the top surface of the evaporation prevention layer to the floor of the trenches be in the range from −0.3 μm to 0.05 μm. Furthermore, nitride semiconductor laser elements according to the present invention can also be applied in cases where, with the p-type and n-type layers reversed in the structure described above, a waveguide is formed on the n-type semiconductor side.

What is claimed is:

1. A nitride semiconductor laser element, comprising:
   a substrate;
   a nitride semiconductor layer laid on a surface of the substrate, the nitride semiconductor layer including an active layer generating laser light and an evaporation prevention layer preventing deterioration of the active layer;
   a stripe-shaped waveguide formed in the nitride semiconductor layer to serve as a light confinement region;
   a mirror facet formed as a result of the nitride semiconductor layer being cleaved; and
   a trench formed at the mirror facet, at least at one side of the stripe-shaped waveguide, the trench being formed on an intended splitting line as a carved region having an opening at a surface of the nitride semiconductor layer, the trench having a floor surface located no more than 0.05 μm above a top surface of the evaporation prevention layer and no more than 0.3 μm below the top surface of the evaporation prevention layer.

2. The nitride semiconductor laser element according to claim 1,
   wherein the trench is formed at a distance of 2 μm or more but 100 μm or less from the stripe-shaped waveguide.

3. The nitride semiconductor laser element according to claim 1,
   wherein a protective film is formed on a surface of the trench.

4. The nitride semiconductor laser element according to claim 1,
   wherein a floor surface of the trench is located at a top surface of the evaporation prevention layer, and a thickness from the floor surface of the trench to the top surface of the evaporation prevention layer is less than 0.05 μm.

5. The nitride semiconductor laser element according to claim 1,
   wherein a floor surface of the trench is located below the evaporation prevention layer, and a thickness from the floor surface of the trench to a top surface of the evaporation prevention layer is 0.3 μm or less.

6. The nitride semiconductor laser element according to claim 1,
   wherein the substrate has a stripe-shaped groove formed therein by being carved from a surface thereof lying in contact with the nitride semiconductor layer down to a depth of 1 μm or more, the stripe-shaped groove being formed parallel to the stripe-shaped waveguide, and
   wherein the stripe-shaped waveguide is formed at a different location from the stripe-shaped groove.

7. The nitride semiconductor laser element according to claim 6,
   wherein at least part of the trench is located between the stripe-shaped waveguide and the stripe-shaped groove.

8. The nitride semiconductor laser element according to claim 1,
   wherein, at each side of the stripe-shaped waveguide, a thickness from a bottom surface thereof to a top surface of the evaporation prevention layer is 0.05 μm or more but 0.2 μm or less.

9. The nitride semiconductor laser element according to claim 1,
   wherein the stripe-shaped waveguide has a width of 5 μm or more but 100 μm or less.

10. The nitride semiconductor laser element according to claim 1,
    wherein the substrate and the nitride semiconductor layer have, as part thereof, a stripe-shaped defect-concentrated region and have, elsewhere than in the defect-concentrated region, a low-defect region, and
    wherein the stripe-shaped waveguide is formed in the low-defect region.

11. The nitride semiconductor laser element according to claim 1,
    wherein the trench is formed perpendicular to the mirror facet and parallel to the stripe shaped waveguide.

12. A method for fabricating a nitride semiconductor laser element, comprising:
    a first step of epitaxially growing, on a substrate, a nitride semiconductor layer including an active layer generating laser light and an evaporation prevention layer preventing deterioration of the active layer;
    a second step of forming, in the nitride semiconductor layer formed in the first step, a stripe-shaped waveguide serving as a light confinement region;
    a third step of cleaving, along with the substrate, the nitride semiconductor layer having the stripe-shaped waveguide formed therein in order to form a mirror facet; and
    a fourth step of carving the nitride semiconductor layer from a surface thereof so as to form, at the mirror facet formed as a result of cleaving performed in the third step, at least at one side of the stripe-shaped waveguide, a trench on an intended splitting line as a carved region having an opening at the surface of the nitride semiconductor layer, the trench having a floor surface located no more than 0.05 μm above a top surface of the evaporation prevention layer and no more than 0.3 μm below the top surface of the evaporation prevention layer.

13. The method for fabricating a nitride semiconductor laser element according to claim 12,
    wherein the fourth step is performed after the second step.

14. The method for fabricating a nitride semiconductor laser element according to claim 12,
    wherein the fourth step is performed before the second step.

15. The method for fabricating a nitride semiconductor laser element according to claim 12, further comprising:
    a fifth step of forming, in a surface of the substrate, a groove parallel to the stripe-shaped waveguide by carving the substrate from the surface thereof lying in contact with the nitride semiconductor layer,
    wherein the fifth step is performed before the first step.

16. The method for fabricating a nitride semiconductor laser element according to claim 12, further comprising:
    a sixth step of forming a protective film on a surface of the trench.

17. The method for fabricating a nitride semiconductor laser element according to claim 12, further comprising:
    a fifth step of forming a groove with a depth of 1 μm or more approximately parallel to the stripe-shaped waveguide before formation of the active layer included in the nitride semiconductor layer.

18. The method for fabricating a nitride semiconductor laser element according to claim 17,
wherein the trench is provided on each side of the stripe-shaped waveguide.

19. The method for fabricating a nitride semiconductor laser element according to claim 17,
wherein the groove has a width of 2 μm or more but 100 μm or less in a direction perpendicular to the stripe-shaped waveguide.

20. The method for fabricating a nitride semiconductor laser element according to claim 12, wherein the trench is formed perpendicular to the mirror facet and parallel to the stripe shaped waveguide.

21. A method for fabricating a nitride semiconductor laser element, comprising:
- a first step of forming a nitride semiconductor layered structure on a substrate by epitaxial growth;
- a second step of forming a plurality of stripe-shaped waveguides serving as light confinement regions in the nitride semiconductor layered structure formed in the first step;
- a third step of forming grooves with a depth of 1 μm or more between the stripe-shaped waveguides formed in the second step; and
- a fourth step of intermittently forming trenches on intended splitting lines as etched regions open at a surface of the nitride semiconductor layered structure, the trenches each having a floor surface located no more than 0.05 μm above a top surface of the evaporation prevention layer and no more than 0.3 μm below the top surface of the evaporation prevention layer, by etching the nitride semiconductor layered structure in at least parts of regions between the stripe-shaped waveguides formed in the second step and the grooves formed in the third step.

22. The method for fabricating a nitride semiconductor laser element according to claim 21,
wherein the trenches have a width of 10 μm or more but 100 μm or less in a length direction of the stripe-shaped waveguides.

23. The method for fabricating a nitride semiconductor laser element according to claim 21,
wherein the trenches have a width of 30 μm or more but 80 μm or less in a length direction of the stripe-shaped waveguides.

24. The method for fabricating a nitride semiconductor laser element according to claim 21,
wherein the trenches have a width of 40 μm or more but 60 μm or less in a length direction of the stripe-shaped waveguides.

25. The method for fabricating a nitride semiconductor laser element according to claim 21, further comprising:
a fifth step of forming mirror facets by cleaving a wafer along the trenches.

26. The method for fabricating a nitride semiconductor laser element according to claim 21, wherein the trench is formed perpendicular to the mirror facet and parallel to the stripe shaped waveguide.

* * * * *